United States Patent
Sung et al.

(10) Patent No.: US 8,477,556 B2
(45) Date of Patent: *Jul. 2, 2013

(54) MEMORY ARCHITECTURE HAVING MULTIPLE PARTIAL WORDLINE DRIVERS AND CONTACTED AND FEED-THROUGH BITLINES

(75) Inventors: Raymond J. Sung, Sunnyvale, CA (US); Dongwook Suh, Saratoga, CA (US); Daniel O. Rodriguez, Hayward, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/191,107

(22) Filed: Jul. 26, 2011

(65) Prior Publication Data

US 2012/0195152 A1 Aug. 2, 2012

Related U.S. Application Data

(60) Continuation of application No. 12/730,873, filed on Mar. 24, 2010, now Pat. No. 8,009,506, which is a division of application No. 11/291,219, filed on Dec. 1, 2005, now Pat. No. 7,697,364.

(51) Int. Cl.
*G11C 8/00* (2006.01)
(52) U.S. Cl.
USPC ............. 365/230.06; 365/230.03; 365/230.02
(58) Field of Classification Search
USPC ........................... 365/230.06, 230.03, 230.02
See application file for complete search history.

(56) References Cited

U.S. PATENT DOCUMENTS

| | | | |
|---|---|---|---|
| 5,406,526 A | 4/1995 | Sugibayashi et al. | |
| 6,111,808 A | 8/2000 | Khang et al. | |
| 6,330,205 B2 | 12/2001 | Shimizu et al. | |
| 6,421,295 B1 | 7/2002 | Mao et al. | |
| 6,747,908 B2 | 6/2004 | Lee et al. | |
| 7,106,649 B2 | 9/2006 | Wada et al. | |
| 7,187,615 B2 | 3/2007 | Park et al. | |
| 7,697,364 B2 | 4/2010 | Sung et al. | |
| 8,009,506 B2 | 8/2011 | Sung et al. | |
| 2002/0054530 A1* | 5/2002 | Chung et al. | 365/222 |
| 2004/0252574 A1* | 12/2004 | Jamshidi et al. | 365/230.06 |
| 2007/0127306 A1 | 6/2007 | Sung et al. | |
| 2010/0177586 A1 | 7/2010 | Sung et al. | |

OTHER PUBLICATIONS

Zhang, Kevin et al., "SRAM Design on 65-nm CMOS Technology With Dynamic Sleep Transistor for Leakage Reduction", IEEE Journal of Solid-State Circuits, vol. 40, No. 4, Apr. 2005, pp. 895-901.

(Continued)

*Primary Examiner* — Toan Le
(74) *Attorney, Agent, or Firm* — Brake Hughes Bellermann LLP

(57) ABSTRACT

Various embodiments are disclosed relating to a memory circuit architecture. In an example embodiment, which may accommodate a change to a new memory size or cell aspect ratio, while migrating between different process nodes or the same process generation, while retaining at least a portion of the periphery circuitry, a memory circuit architecture may be employed in which the memory array is divided into an upper half and a lower half, thereby splitting the cache Ways among the two halves. The wordline may be split among the two array halves, with each half driven by a half wordline driver. Also, in another embodiment, two sets of bitlines may be provided for each column, including a contacted set of bitlines and a feed-through set of bitlines.

16 Claims, 5 Drawing Sheets

OTHER PUBLICATIONS

Kim, K. J. et al., "A Novel 6.4 Full-CMOS SRAM Cell with Aspect Ratio of 0.63 in a High-Performance 0.25-Generation CMOS Technology", 1998 Symposium on VLSI Technology Digest of Technical Papers, pp. 68-69.

Yun, Kenneth "Memory", Adapted from EE271 Notes, Stanford University, 32 pages.

Wilton, Steven J., et al., "An Enhanced Access and Cycle Time Model for On-Chip Caches", WRL Research Report 93/5, (Jul. 1994), pp. 73.

Non Final Office Action received for U.S. Appl. No. 11/291,219, mailed on Apr. 30, 2008, 8 pages.

Non Final Office Action received for U.S. Appl. No. 11/291,219, mailed on Mar. 3, 2009, 10 pages.

Notice of Allowance received for U.S. Appl. No. 11/291,219, mailed on Dec. 2, 2009, 6 pages.

Non Final Office Action Response filed for U.S. Appl. No. 11/291,219, mailed on Aug. 3, 2009, 7 pages.

Non Final Office Action Response filed for U.S. Appl. No. 11/291,219, filed on Sep. 2, 2008, 10 pages.

U.S. Appl. No. 12/730,873 Notice of Allowance mailed Apr. 22, 2011, 13 pgs.

Notice of Allowance received for U.S. Appl. No. 12/730,873, mailed on Apr. 22, 2011, 13 pages.

* cited by examiner fb_ == feed-through bitline
× == bitline contacting cell

MEMORY ARCHITECTURE HAVING MULTIPLE PARTIAL WORDLINE DRIVERS AND CONTACTED AND FEED-THROUGH BITLINES

CROSS-REFERENCE TO RELATED APPLICATIONS

This application is a continuation of U.S. patent application Ser. No. 12/730,873, filed Mar. 24, 2010, entitled "Memory Architecture Having Multiple Partial Wordline Drivers and Contacted and Feed-through Bitlines," which is a divisional application of U.S. application Ser. No. 11/291,219, filed Dec. 1, 2005, now U.S. Pat. No. 7,697,364, entitled "Memory Architecture Having Multiple Partial Wordline Drivers and Contacted and Feed-through Bitlines," the disclosures of both applications being incorporated herein by reference in their entirety.

BACKGROUND

In many silicon foundry processes above 90 nm, the memory cells often have a low aspect ratio, e.g., the cells are tall and skinny in order to limit or decrease the effects of driving polysilicon wordlines across the width of the memory array. However, in many processes under 90 nm, foundries may typically provide memory cells that have a high aspect ratio, e.g., the cells are wide and short. This is typically because wide cells (having a high aspect ratio) may be easier to manufacture for deep submicron processes because, for example, the these cells can accommodate polysilicon and diffusion areas that runs in a single direction, may be assembled in a smaller footprint (e.g., allowing denser memory arrays in some cases) and/or may have a lower bitline capacitance at these geometries in some cases. Also, different foundries may use either of the two aspect ratios depending on the maturity of their process technology.

For systems, such as microprocessors, embedded processors, processor system on chips (SOCs) and others, companies may desire faster frequencies and higher levels of chip integration that smaller process geometries may provide, and Integrated Circuit (IC) companies may often desire faster time-to-market to satisfy these requests or demands. However, process migration for memory arrays may provide a significant challenge since the periphery circuitry (e.g., wiring, address decoders, wordline drivers, column muxes, sense amps, precharge circuits, I/O and datapath circuitry, and the like) for the memory circuit may often be custom designed and may even pitch-matched or otherwise tailored (e.g., in one or more respects) to the size or aspect ratio of the memory cell being used. Thus, at least in some cases, a change in the memory cell size or aspect ratio may often require significant changes in the periphery circuitry for the memory circuit, which may add expense and introduce further delay in completing a product.

SUMMARY

Various embodiments are disclosed relating to memory circuit architecture, such as a memory architecture having multiple partial wordline drivers and/or contacted and feed-through bitlines.

According to an example embodiment, a memory circuit may include a memory array, which may include a plurality of memory cells. The memory circuit may include a plurality of partial wordline drivers to be activated together in response to an address to drive a complete wordline. Each partial wordline driver may be coupled to a partial wordline. In an example embodiment, a first wordline driver may drive a partial wordline in response to an address, while a second partial wordline driver may drive a second partial wordline in response to the address.

According to another embodiment, a memory circuit may include a memory array, which may include a plurality of memory cells, including a first group of memory cells. The memory circuit may also include a first set of bitlines that contacts the first group of memory cells in the memory array, and a second group of bitlines that feeds through the first group of memory cells and does not contact the first group of memory cells.

In another example embodiment, a first set of bitlines may be provided that may operate as a contacted set of bitlines for a first group of memory cells (e.g., an upper half of an array) and operates as a feed-through set of bitlines for a second group of memory cells (e.g., a lower half of the array). A second set of bitlines may be provided that operate as a feed-through set of bitlines for the first group of memory cells and operate as a contacted set of bitlines for the second group of memory cells.

DETAILED DESCRIPTION

Figure 1:
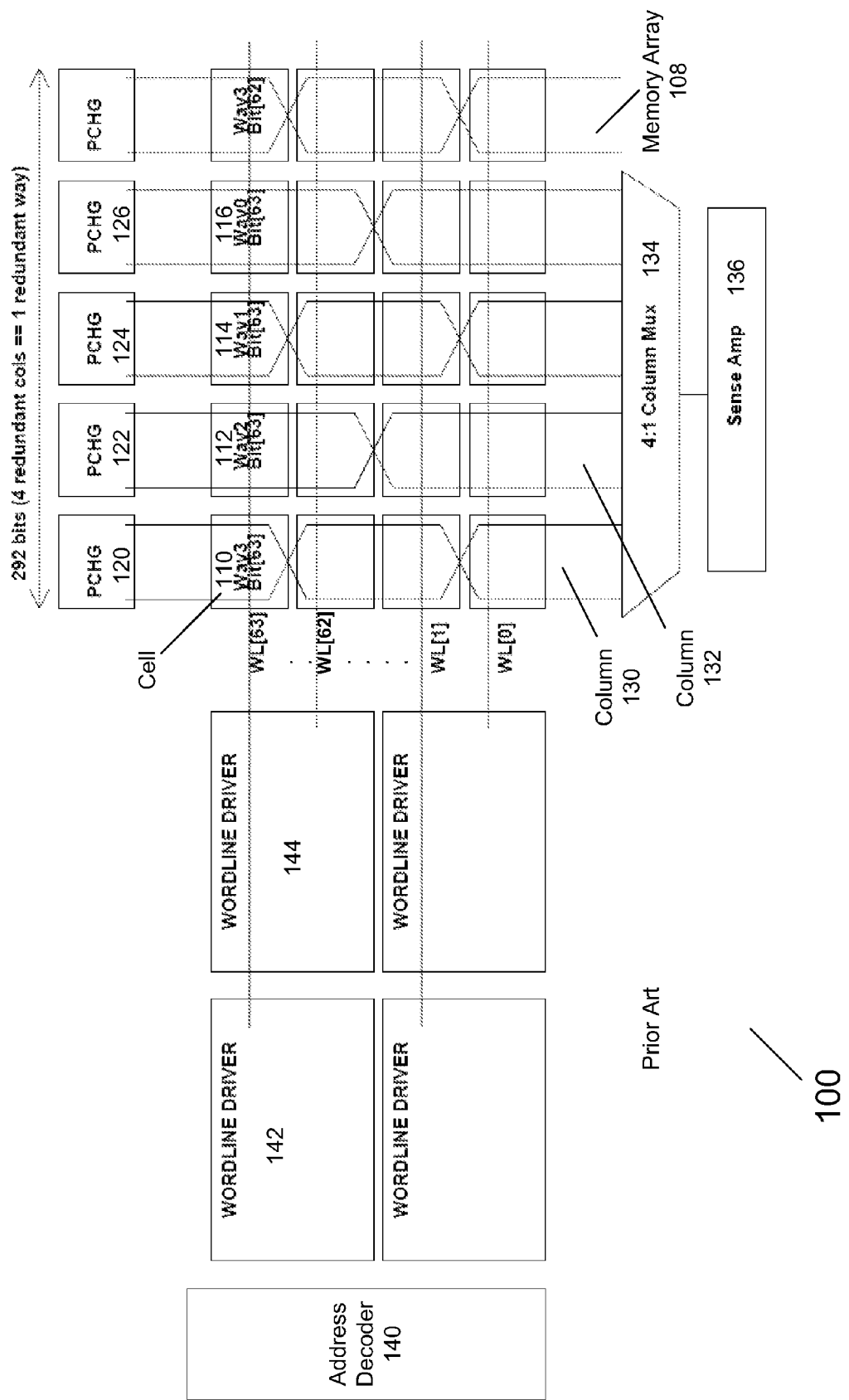
FIG. 1 is a block diagram of a memory circuit in which the memory cells have a low aspect ratio.

FIG. 1 is a block diagram of a memory circuit in which the memory cells have a low aspect ratio. The memory circuit 100 may include a memory array 108 that may include a number of memory cells, such as 292 columns and 64 rows (although FIG. 1 shows a simplified view of the memory circuit 100 showing only 4 rows and 5 columns). This example memory array 108 may be a 4-way set associative cache, although other types of memory arrays may be used. The memory cell technology used for memory array 108 may be static random access memory (SRAM), for example, although other memory technologies may be used as well (e.g., dynamic random access memory or DRAM, and others). A wordline (WL) may be provided on each row of memory array 108, such as wordlines WL(0), WL(1), . . . WL(63). Wordline WL(63) may include memory cell 110 (Way 3 of bit 63), memory cell 112 (Way 2 of bit 63), memory cell 114 (Way 1 of bit 63) and memory cell 116 (Way 0 of bit 63), etc. Thus, each bit may include four memory cells, one cell for each Way.

An address decoder 140 may decode addresses. A wordline driver is provided to drive each wordline when the wordline driver is activated. In this example, two wordline drivers are provided for the pitch of two wordlines (or one wordline driver per wordline). Address decoder 140 decodes a received address, and may then activate one of the wordline drivers to drive a selected wordline based on the address. Typically, only one wordline is driven (e.g., driven high) at a time. For example wordline driver 142, when activated, drives wordline WL(63) based on a first address, while wordline driver 144, when activated, drives wordline WL(62) based on a second address.

Each column of memory cells is coupled to or associated with a pair of bitlines, typically referred to as bitline-low (BL) and bitline-high (BH). Therefore, each memory cell along the selected row or wordline is associated with a pair of bitlines. Data may be read from or written to a memory cell via the bitlines. A precharge circuit is coupled to each pair of bitlines to precharge the bitlines to speed up the read operation. Precharge circuits may include, for example, precharge circuits 120 (e.g., for a first column), 122 (e.g., for a second column), 124 and 126. Column multiplexers may be provided to multiplex the bitlines, such as the read column mux 134 for example. Also, sense amplifiers (sense amps) may be coupled to the read column muxes 134, such as sense amp 136, to read small differences in the bitline voltage that occurs during fast read operations. Also, write column muxes (not shown) may be coupled to the bitlines to transfer write data from the write amplifiers to the memory cells for each set of bitlines. Write amplifiers (not shown) may also be provided.

The memory cells of memory array 108 may be considered to have a low aspect ratio, e.g., the cells are tall and skinny. According to an example embodiment, it may be desirable to migrate to another process that may employ memory cells of a different size or aspect ratio. For example, it may be desirable to migrate to a semiconductor process that uses memory cells having a high (or at least higher) aspect ratio, e.g., the cells are wide and short. According to an example embodiment, this migration may involve reducing the minimum transistor length for the transistors in memory circuit 100 or keeping the minimum transistor length in memory circuit 100 the same but changing the aspect ratio only. In some cases, cells that are short and wide (high aspect ratio) may be easier to manufacture for deep submicron processes, which may result in higher yields, may be assembled in a smaller footprint (e.g., allowing denser memory arrays in some cases) and/or may have a lower bitline capacitance at these geometries in some cases, for example. However, in some cases, the process migration for memory arrays may be a fairly expensive and time consuming process since the periphery circuitry (e.g., wiring, address decoders, wordline drivers, read column muxes, sense amps, precharge circuits, write column muxes, write amplifiers, and the like) for the memory circuit is often specifically tailored to the size or aspect ratio of the memory cell. Thus, in many cases, a migration to a new memory cell size or aspect ratio may typically involve a substantial redesign of such periphery circuitry for the memory circuit, which may be relatively expensive and/or time consuming, at least in some cases.

According to an example embodiment, a number of techniques may be used to accommodate a change in a memory cell aspect ratio or size in a memory circuit to allow re-use of at least a portion of a periphery circuitry of the memory circuit. Various example embodiments of these techniques will be described below and with reference to FIGS. 2-5.

Figure 2:
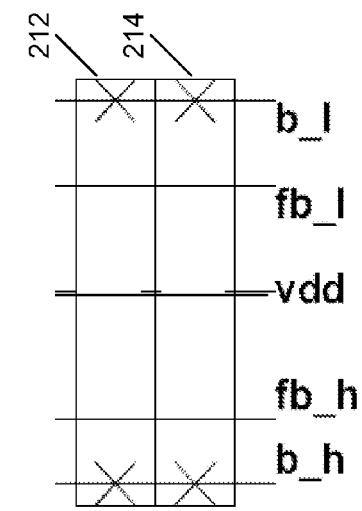
FIG. 2 is a diagram illustrating memory cells and bitlines for low aspect ratio cells and high aspect ratio cells according to an example embodiment.
Figure 2:
Figure 2:
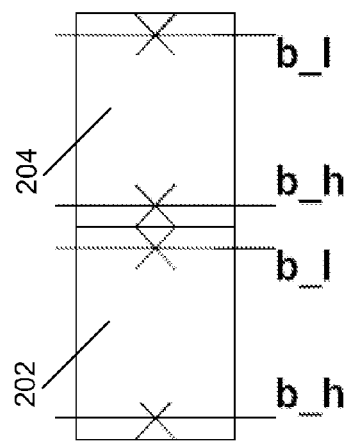

FIG. 2 is a diagram illustrating memory cells and bitlines for low aspect ratio cells and high aspect ratio cells according to an example embodiment. The low aspect ratio cells include cells 202 and 204. These low aspect ratio cells (202, 204) in FIG. 2 may be the same or similar to the cells of memory array 108, illustrated in FIG. 1. It may be desirable to migrate from a low aspect ratio cells 202, 204 to a high aspect ratio cells (or to migrate to cells having a different size), for example. Two high aspect ratio cells include cells 212 and 214 shown in FIG. 2. According to an example embodiment, two high aspect ratio cells 212, 214 are approximately the same height as one low aspect ratio cell 202, 204. In addition, maybe with or maybe without some additional cell sizing, the width of one high aspect ratio cell 212, 214 may be approximately the same width as two low aspect ratio cells 202, 204, according to an example embodiment. Therefore, according to an example embodiment, two high aspect ratio cells 212, 214 may be stacked to approximately the same height and width of two low aspect ratio cells 202, 204 provided side-by-side. Although, such a fit of two new cells fitting into the space of two old cells is not required, as this is just an example. The various techniques and examples described herein are not limited to the ratios and cells illustrated in FIG. 2, but may apply to a wide variety of processes or cell size migrations.

Based on the ratios of new cell size to old cell size, two high aspect ratio cells 212, 214, for example, may be stacked to replace two side-by-side low aspect ratio cells 202, 204 in a memory array. According to an example embodiment, this may allow a memory circuit to migrate to (or use) the new high aspect cells in the memory array. As described in greater detail below, through one or more memory circuit architecture modifications, a substantial portion of the periphery circuitry may be retained or re-used for a memory circuit employing the new (e.g., high aspect ratio) memory cells.

As described in greater detail below, in order to accommodate a change to a new memory cell aspect ratio while retaining a significant portion of the periphery circuitry, a memory circuit architecture may be employed in which the memory array is divided into an upper half and a lower half, thereby splitting the cache Ways among the two halves, according to an example embodiment. Thus, the wordline may be split among the two array halves, with each half driven by a half wordline driver, with both half wordline drivers for a wordline being activated in response to an address. Also, two sets of bitlines may be provided for each column, including a contacted set of bitlines that may contact the cells of an upper half of the array, and feed-through set of bitlines that may feed through the upper half of the array and contact the cells of the lower half of the array.

In FIG. 2, there are two bitlines which contact each cell. A bitline-low (BL or b_l) and bitline-high (BH or b_h) contacts each original low aspect ratio memory cell 202, 204 (contact in cell shown by X in FIG. 2). However, the two high aspect ratio cell are stacked on top of one another, and the outside bitlines (b_h and b_l) contact these two cells (212, 214) (e.g., contacting the memory cell's access transistor drain terminal). The inner bitlines (fb_h and fb_l in FIG. 2) for the high aspect ratio cells may be considered feed-through bitlines as they feed through these cells, without contacting the memory cell's access transistor drain terminal, and may contact other cells in a lower half of the array (not shown).

Figure 3:
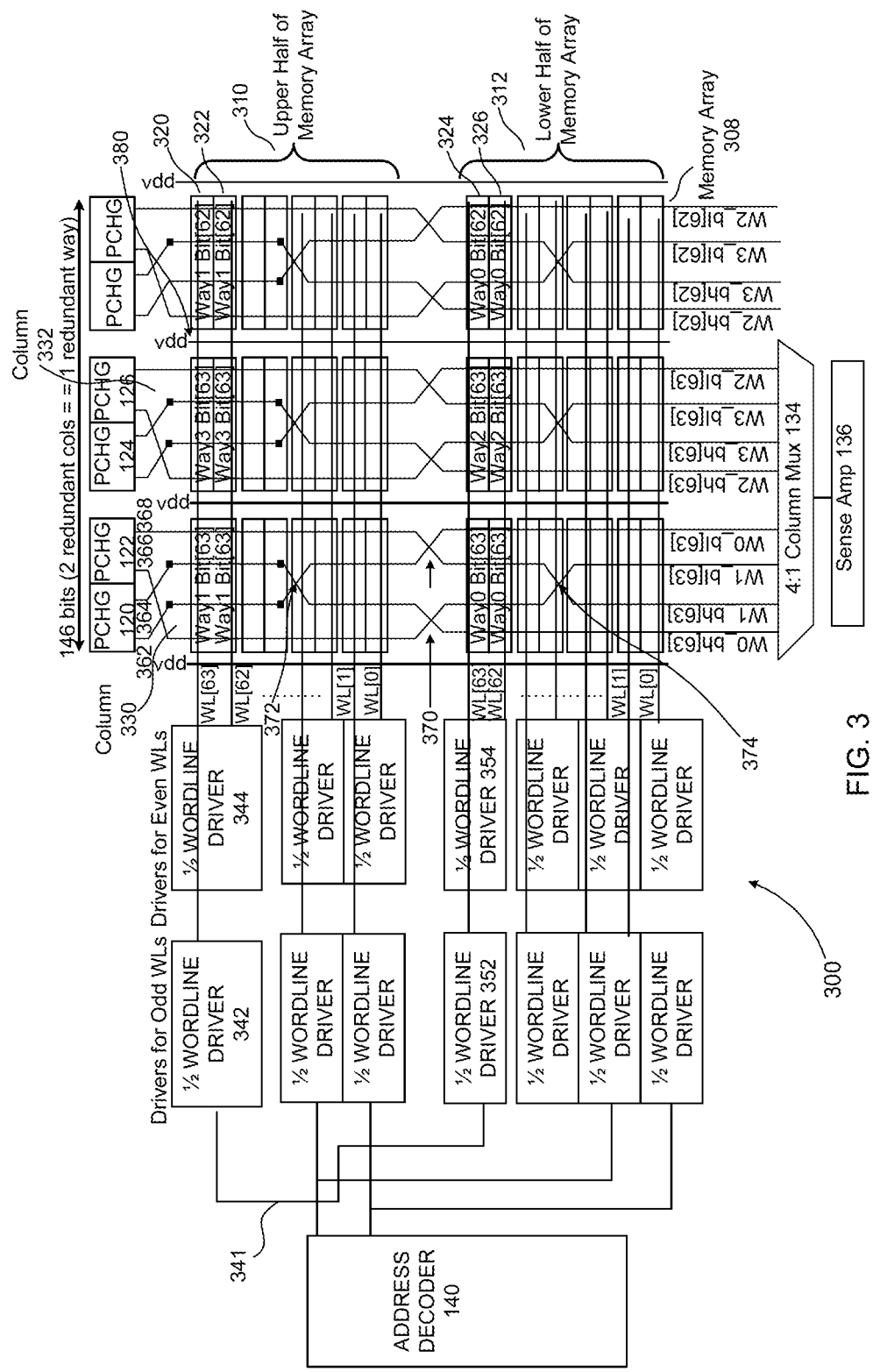
FIG. 3 is a block diagram of a memory circuit according to an example embodiment.

FIG. 3 is a block diagram of a memory circuit according to an example embodiment. Memory circuit 300 includes a memory array 308 that may include a plurality of memory cells. Only a few rows and columns are shown for memory array 308, although it may be of any size. The memory cells used for memory array 308 may be a different aspect ratio or size than the memory cells used in the memory array 108 for the memory circuit 100 (FIG. 1). However, one or more changes to the memory circuit architecture may allow memory circuit 300 to retain or re-use at least a portion of the periphery circuitry used in the memory circuit 100 (FIG. 1). These changes may include, for example, dividing the array into array halves, changing the wiring for the bitlines to allow the same precharge circuits to be used, and providing a partial (e.g., half) wordline driver for each row, among other possible changes or modifications.

In the example memory circuit 308 shown in FIG. 3, a portion of the periphery circuitry including address decoder 140, precharge circuits (e.g., precharge circuits 120, 122, 124, 126, . . . ), the read column muxes (such as read column mux 134) and sense amps (including sense amp 136) may be the same as those used in memory circuit 100 (FIG. 1). Note, that while the example memory circuit 300 shows column muxes (e.g., read column mux 134) before sense amps (e.g., sense amp 136), these circuits may be reversed to provide sense amps before read column muxes, for example.

The memory array 308 may use memory cells (such as memory cells 212, 214, FIG. 2) having a high aspect ratio, for example. Also, the memory array 308, according to an example embodiment, may be divided into multiple array portions, such as an upper half 310 and a lower half 312, with the four Ways of each bit being split among the two memory halves (e.g., two Ways of a bit in the upper half 310 and two Ways of the bit in a lower half 312). Each memory array half may include 146 columns and 64 rows, as an example. The two array halves 310, 312 (each 146×64) together may provide a memory array that is the same bit capacity (292 and 64) as the memory array 108 in FIG. 1, according to an example embodiment.

Referring to memory circuit 300 (FIG. 3), several columns are shown, including column 330 and column 332. Each column includes memory cells in both upper half 310 and lower half 312. According to an example embodiment, two sets of bitlines may be associated with each column. Also, according to an example embodiment, two precharge circuits may be associated with each column. For example, precharge circuits 120 and 122 may be associated with or supply precharge for memory cells of column 330, while precharge circuits 124 and 126 may be associated with or supply precharge for memory cells of column 332. However, the wiring from the precharge circuits has been modified (as compared to bitline wiring of FIG. 1) in memory circuit 300 to accommodate the memory cell high aspect ratio, while allowing re-use of or retaining the original precharge circuits used for memory circuit 100, FIG. 1.

For example, a first set of bitlines (bitlines 366 and 368) are coupled to precharge circuit 122 and contact (e.g., contact the memory cell access transistor drains) the memory cells in upper half 310 of column 330, and feed-through (e.g., without contacting) the memory cells of the lower half 312 of the column 330. Thus, the first set of bitlines (366, 368) may be considered as a contacted set of bitlines for the column 330 in upper array 310 and as a feed-through set of bitlines for the column 330 in lower half 312 of array 308. On the other hand, a second set of bitlines (bitlines 362 and 364) are coupled to precharge circuit 120 and operate as a feed-through set of bitlines (e.g. without contacting) for the memory cells in upper half 310 of column 330, and as a contacted set of bitlines for memory cells in lower half 312 of column 330.

According to an example embodiment, in the upper half 310 of array 308, the first set of bitlines (366, 368) are outer bitlines, while the second set of bitlines (362, 364) are inner bitlines (although this bitline arrangement could be changed or flipped). Thus, the outer bitlines (as also shown in FIG. 2) may operate as a contacted set of bitlines and the inner bitlines may operate as feed-through bitlines for the upper half 310. According to an example embodiment, a design that uses the outer bitlines as the contacted bitlines may allow memory cells (e.g., cell access transistor drain terminal) to be contacted by the bitline in the same locations as memory circuit 100 (FIG. 1). As an advantage of an example embodiment, the line capacitance associated with each bitline in memory circuit 300 may be unchanged from that of memory circuit 100, since each bitline runs approximately the height of the memory array 308 and each bitline contacts the same number of memory cells in memory array 108 and 308.

The positions or locations of one or more of the bitlines may be swapped or twisted at point 370 to move the inner bitlines to the outer positions, and to move the outer bitlines to the inner positions. This allows the set of bitlines (e.g., 366, 368) that operate as a contacted set of bitlines for the upper half 310 to move to inner positions to operate as a feed-through set of bitlines for the lower half 312, and likewise, to allow the set of bitlines (e.g., 362, 364) that operate as a feed-through set of bitlines for the upper half 310 to move to outer positions to operate as a contacted set of bitlines for the lower half 312. In this example embodiment, bitlines 364 and 366 are swapped, while bitlines 362 and 368 are swapped at point 370.

The twisting or swapping of the contacted and feed-through bitlines between the top half 310 and the bottom half 312 (e.g., at point 370) may, in some cases, introduce asymmetrical capacitive coupling to adjacent bitline pairs. This issue may be resolved for two pairs of adjacent bitlines (e.g. bitlines 362, 364, 366, 368), for example, by twisting the feed-through bitlines at intervals of ⅓ down the memory array 308 (e.g., at point 372) and at ⅔ down the memory array 308 (e.g., at point 374), or at intervals of ¼ or ¾ down the memory array 308, or at other intervals. This may allow bitline pairs to receive approximately equal coupling from pairs of adjacent bitlines. To eliminate coupling of pairs of bitlines from other pairs of bitlines, power rails, such as Vdd 380 (FIG. 3) in an example embodiment, may be added between columns of memory cells. These power rails, provided between columns, may operate as shield rails or shields and can be added as part of the memory cell in an example embodiment, as the memory array 308 may include multiple instances of the memory cells 212, 214, etc.

As an added advantage of the twisting of feed-through bitlines (e.g., at ⅓ and ⅔ down the memory array, for example, at points 372 and 374), the wiring to the read column multiplexers (e.g., read column mux 134 if sense amps come after read column muxes) does not have to be modified, according to an example embodiment. Likewise, the wiring of bitlines to sense amps (for designs when read column muxes come after sense amps) do not have to be modified either, according to an example embodiment.

In an example embodiment, memory circuit 300 may be a 4-Way set associative level 1 (L1) data cache, although this is merely an example, and the various techniques described herein may be applied to a wide variety of memory circuits. In order to fit the new memory array 308 (based on the new high aspect ratio cell) into a same or similar footprint as the old memory array 108 (FIG. 1), the memory array 308 is divided into an upper half 310 and a lower half 312, with the 4 Ways for each bit divided among the halves.

For example, row 320 in the upper array 310 includes a number of memory cells including the cell for Way 1 (bit 63) (in column 330) and the cell for Way 3 (bit 63) (in column 332). Row 324 in lower half 312 includes a memory cell for Way 0 (bit 63) (in column 330) and a memory cell for Way 2 (bit 63) (in column 332). Thus, the 4 ways for bit 63 (of wordline 63) are divided amongst row 320 (in upper half 310) and row 324 (in lower half 312).

According to an example embodiment, each row in the upper half 310 and lower half 312 may be a half wordline, with two corresponding half wordlines (e.g., one half wordline in each half (310 and 312) comprising one complete wordline that is driven in response to an address. The memory cells for all 4 Ways of a bit should be should enabled for reading and writing in response to an address. Therefore, two half wordline drivers are provided to drive two half wordlines, for example. Or, a half wordline driver may drive each half wordline. For example, in upper half 310, half wordline driver 342 may drive row (half wordline) 320, half wordline driver 344 may drive row (half wordline) 322. In lower half 312, for example, half wordline driver 352 may drive row (half wordline) 324 and half wordline driver 354 may drive row (half wordline) 326.

Corresponding half wordline drivers (e.g., one driver in upper half 310 and one driver in lower half 312) are typically activated by address decoder 140 in response to an address, according to an example embodiment. This may allow both corresponding half wordlines to be driven in response to a particular address, including one half wordline in upper half 310 and one half wordline in lower half 312. For example, in response to an address, the half wordline driver 342 (upper half 310) may drive half wordline (row) 320 (corresponding to WL 63), and half wordline driver 352 may drive row 326 (also corresponding to WL 63), with the two rows or half wordlines (320, 324) together providing a complete wordline (WL 63) that is driven in response to the same address. As shown in FIG. 3, line 341 may be enabled by address decoder 140 to activate both half wordline drivers 342 and 352 in response to an address, to thereby drive a complete wordline (WL 63). Similarly, in response to another address, half wordline drivers 344 and 354 may drive half wordlines or rows 322 and 326, respectively.

Since the number of access transistor gate loads on the wordlines have been reduced by half from the original memory array 108, and that the wordline loading is gate dominated typically, the drive strength (and thus, size) of the half wordline drivers may be reduced by half as compared to the wordline drivers in the original memory array 108 (FIG. 1), for example. However, there may be twice as many half wordline drivers in memory array 308 (FIG. 3) as compared to the number of wordline drivers in the original memory array 108 (FIG. 1). Therefore, according to an example embodiment, a same or similar number of transistors may be used to provide the drivers in array 308 as in array 108, although this is not required of course.

The techniques and/or memory circuit architecture(s) described herein may be used in a variety of applications, such as for a multiprocessor SOC, or to any design with custom or semi-custom memory arrays such as in microprocessors, multi-core processors, embedded processors and other processor SOCs. It may be applied to a wide variety of other circuits and applications as well.

The example techniques and/or memory circuit architecture(s) described herein may, for example, apply to a technology migration between two processes of the same size (e.g. having different aspect ratios), as well as for process migration of memory array of a larger geometry to a smaller process geometry, or from a smaller geometry to a larger geometry, etc. The techniques and/or memory circuit architecture(s) described herein may also apply to applications or memory circuits that do not involve process migration, for example.

Furthermore, techniques and/or memory circuit architecture(s) described herein may also be incorporated into memory compilers or memory tiling tools to reduce timing variations for an array tiled in different processes and process geometries.

The techniques and/or memory circuit architecture(s) described herein may apply to designs that use staggered WL drivers with two drivers in the pitch of two memory array rows as in memory circuit 100 (FIG. 1). Thus each memory row may have its own wordline driver. However, various techniques and memory circuit architectures described above may be applied to designs where one wordline driver is pitch matched to one memory array row or may be applied to other memory designs.

The example memory circuit architecture described herein (e.g., see FIG. 3) may be, for example, a 4-way set associative cache. However, the various techniques or approaches described herein may apply to a wide variety of memory designs or architectures. For example, the various techniques may be applied to an N-way set associative cache, or to a direct-mapped cache. For example, in an example 4-way set associative cache, for any particular bit position, the upper array half wordline (WL) driver may connect to Way 1 and Way 3 (as examples) while the lower array half WL driver may connects to Way 0 and Way 2. (Although other variations on this may be used as well). As another example, in a 6-way set associative cache for any particular bit position, the upper half WL driver may connect to Way 1, Way 3 and Way 5 while the lower half WL driver may connect to Way 0, Way 2 and Way 4. For a 6-way set associative array (as with the 4-Way set associative cache), the WL drivers for the upper and the lower array rows may each drive one-half the gate loading of the original memory array 100 and so these driver transistors can be reduced by a half of their original size, according to an example embodiment.

In another example embodiment, a direct-mapped cache may have two consecutive bits in a cache line split between the upper and lower halves instead of splitting Ways among the upper and lower halves, for example. Furthermore, this design may easily accommodate array redundancy by treating any extra redundancy columns as a group of Way columns that are split over upper and lower arrays, such as in traditional data columns, and with any extra redundancy rows split over lower and upper arrays with half wordline drivers for a particular redundancy address.

Figure 4:
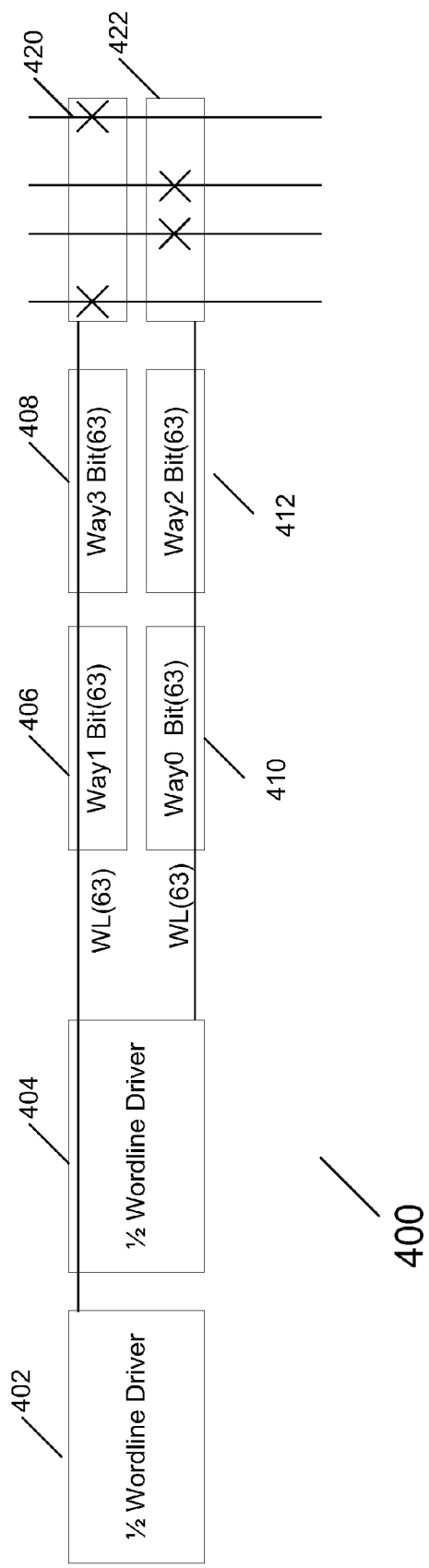
FIG. 4 is a diagram illustrating a memory circuit architecture according to another example embodiment.

FIG. 4 is a diagram illustrating a memory circuit architecture according to another example embodiment. As shown in FIG. 4, another example embodiment may provide two consecutive memory array rows mapped to the same address through duplicating and shorting the inputs of the two consecutive half wordline drivers. For example, as shown in FIG. 4, half wordline driver 402 may drive cells for Way 1 (cell 406) and Way 3 (cell 408) for wordline 63, while half wordline driver 404 may drive Way 0 (cell 410) and Way 2 (cell 412) for wordline 63. Thus, two half wordline drivers may drive two consecutive half wordlines in response to one address. This may be an architecture (in FIG. 4) where the memory array may not be divided into upper and lower halves, for example. This type of alternative architecture, in some cases, may allow two different memory cells to be provided, where one cell's access transistor drains contact the normal bitlines and the other cell's access transistor drains contact the feed-through bitlines, according to an example embodiment. In such an example embodiment, a first type of memory cell (e.g., cell 420) that contacts the outer bitlines may alternate rows with a second type of memory cell (e.g., cell 422) that contacts the inner bitlines. In such an example embodiment, no twisting of the feed-through and contacted bitlines would be necessary at the center of the array. Many other architectures or implementations may be used.

Figure 5:
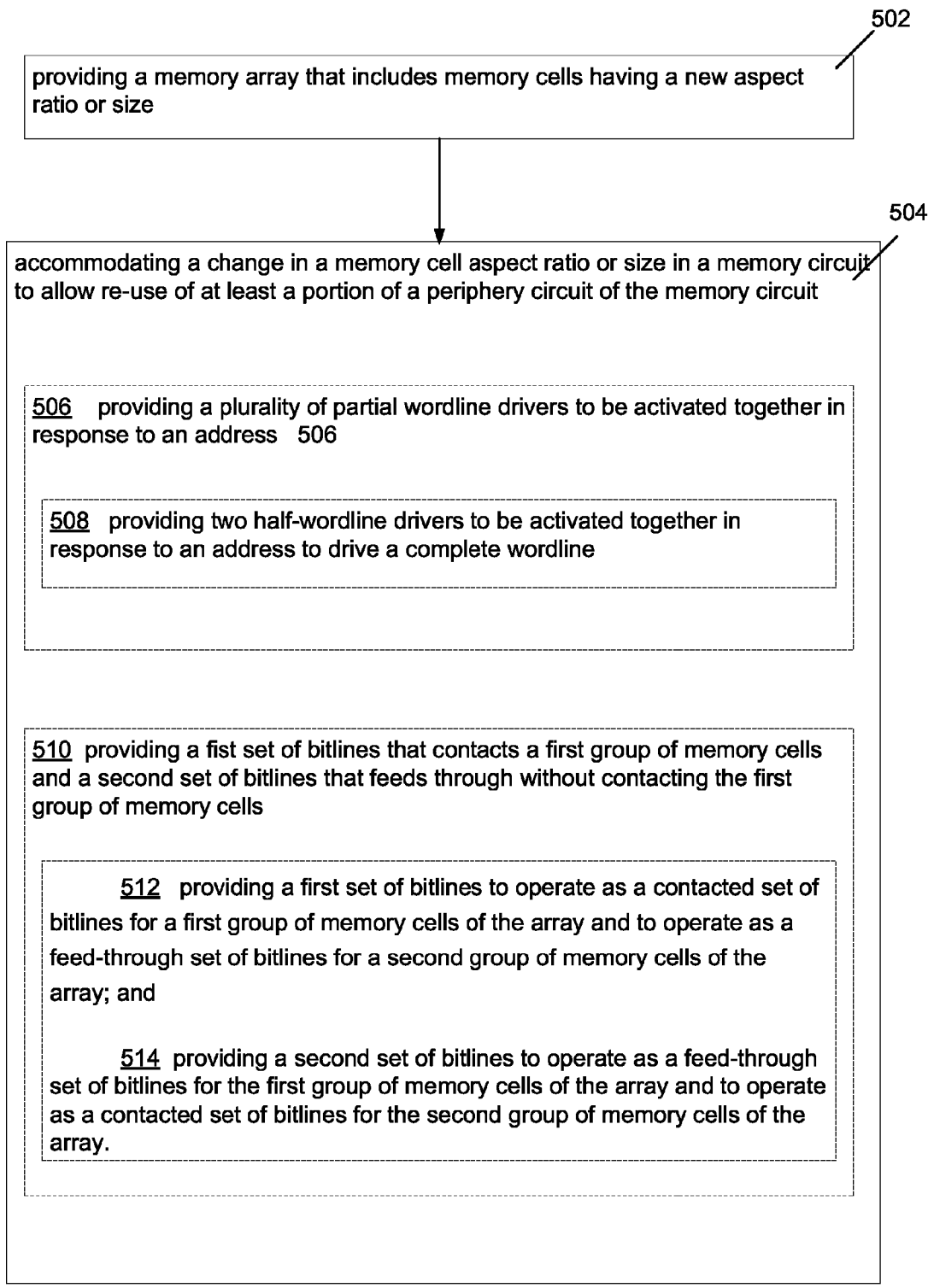
FIG. 5 is a flow chart illustrating operation or construction of a memory circuit according to an example embodiment.

FIG. 5 is a flow chart illustrating operation or construction of a memory circuit according to an example embodiment. At 502, a memory array may be provided that includes memory cells having a new size or aspect ratio. This may involve, for example, providing memory cells having a high aspect ratio, whereas a low aspect ratio or other size may have been originally provided in the memory circuit.

At 504, a change in a memory cell aspect ratio or size is accommodated in a memory circuit to allow a re-use of at least a portion of a periphery circuitry of the memory circuit.

For example, at 506, a plurality of partial wordline drivers may be activated together in response to an address. According to an example embodiment, two half wordline drivers may be activated in response to an address, 508. This may, for example, allow a complete wordline to be driven by activating a plurality of partial wordlines together. This may allow a memory array to be re-organized or modified to accommodate a change in memory cell size or aspect ratio, for example, while possibly reusing or retaining some of the periphery circuitry of the original memory circuit.

Alternatively, at 510, a first set of bitlines may be provided that contacts a first group of memory cells, and a second set of bitlines may be provided that feeds through without contacting the first group of memory cells. For example, at 512, a first set of bitlines may be provided to operate as a contacted set of bitlines for a first group of memory cells of the array and to operate as a feed-through set of bitlines for a second group of memory cells of the array. Also, at 514, a second set of bitlines may be provided to operate as a feed-through set of bitlines for the first group of memory cells of the array and to operate as a contacted set of bitlines for the second group of memory cells of the array. Similarly, such an arrangement may allow a re-organization or modification of the memory array to accommodate a change in memory cell size or aspect ratio, or other changes.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

The migration of memory cells from a low aspect ratio to cells having a high aspect ratio, and associated techniques described herein to accommodate the new cell aspect ratio or size, is merely an example. In other cases it may be desirable to use cells having a low aspect ratio, and/or to accommodate a process migration from cells having a high aspect ratio to cells having a low aspect ratio for example, or other changes.

What is claimed is:

1. A memory circuit comprising:
    a memory array including a plurality of memory cells, the memory array including an upper half and a lower half;
    a first set of bitlines provided as outer bitlines operating as contacted bitlines for the upper half of the memory array, and wherein the first set of bitlines are provided as inner bitlines operating as feed-through bitlines for the lower half of the memory array; and
    a second set of bit lines provided as inner bitlines operating as feed-through bitlines for the upper half of the memory array, and wherein the second set of bitlines are provided as outer bitlines operating as contacted bitlines for the lower half of the memory array.

2. The memory circuit of claim 1 wherein locations of the first and second sets of bitlines are swapped approximately midway between the first half and the second half of the memory array.

3. The memory circuit of claim 1 wherein locations of the first and second sets of bitlines are swapped approximately midway between the first half and the second half of the memory array such that the first set of bitlines are outer bitlines and inner bitlines for the upper half and lower half, respectively, of the memory array, and wherein the second set of bitlines are inner bitlines and outer bitlines for the upper half and lower half, respectively, of the memory array.

4. The memory circuit of claim 1 and further comprising:
    a plurality of partial wordline drivers to be activated together in response to an address to drive a complete wordline, each partial wordline driver coupled to a partial wordline.

5. The memory circuit of claim 4 wherein each of the partial wordline drivers is coupled to a row of the memory array, each row comprising a partial wordline.

6. The memory circuit of claim 4 and further comprising an address decoder coupled to the plurality of partial wordline drivers.

7. The memory circuit of claim 1 and further comprising two half-wordline drivers, each of the half-wordline drivers coupled to a half-wordline, the two half-wordline drivers to be activated together in response to an address to drive a complete wordline.

8. The memory circuit of claim 1 and further comprising:
    a first half-wordline driver coupled to a first half-wordline of the upper half of the memory array; and
    a second half-wordline driver coupled to a second half-wordline of the lower half of the memory array, both of the first half-wordline driver and the second half-wordline driver to be activated together in response to an address to drive a complete wordline.

9. A memory circuit comprising:
    a memory array including a plurality of memory cells, the memory array including an upper half and a lower half;
    a first set of bitlines provided as inner bitlines operating as contacted bitlines for the upper half of the memory array, and wherein the first set of bitlines are provided as outer bitlines operating as feed-through bitlines for the lower half of the memory array; and
    a second set of bit lines provided as outer bitlines operating as feed-through bitlines for the upper half of the memory array, and wherein the second set of bitlines are provided as inner bitlines operating as contacted bitlines for the lower half of the memory array.

10. The memory circuit of claim 9 wherein locations of the first and second sets of bitlines are swapped approximately midway between the first half and the second half of the memory array.

11. The memory circuit of claim 9 wherein locations of the first and second sets of bitlines are swapped approximately midway between the first half and the second half of the memory array such that the first set of bitlines are inner bitlines and outer bitlines for the upper half and lower half, respectively, of the memory array, and wherein the second set of bitlines are outer bitlines and inner bitlines for the upper half and lower half, respectively, of the memory array.

12. The memory circuit of claim 9 and further comprising:
    a plurality of partial wordline drivers to be activated together in response to an address to drive a complete wordline, each partial wordline driver coupled to a partial wordline.

13. The memory circuit of claim 12 wherein each of the partial wordline drivers is coupled to a row of the memory array, each row comprising a partial wordline.

14. The memory circuit of claim 12 and further comprising an address decoder coupled to the plurality of partial wordline drivers.

15. The memory circuit of claim 9 and further comprising two half-wordline drivers, each of the half-wordline drivers coupled to a half-wordline, the two half-wordline drivers to be activated together in response to an address to drive a complete wordline.

16. The memory circuit of claim 9 and further comprising:
a first half-wordline driver coupled to a first half-wordline of the upper half of the memory array; and
a second half-wordline driver coupled to a second half-wordline of the lower half of the memory array, both of the first half-wordline driver and the second half-wordline driver to be activated together in response to an address to drive a complete wordline.

\* \* \* \* \*